United States Patent
Kim et al.

(10) Patent No.: US 7,194,056 B2
(45) Date of Patent: Mar. 20, 2007

(54) DETERMINING PHASE RELATIONSHIPS USING DIGITAL PHASE VALUES

(75) Inventors: Jun Kim, Los Altos Hills, CA (US); Michael T. Ching, Los Altos, CA (US)

(73) Assignee: Rambus Inc., Los Altos, CA (US)

( * ) Notice: Subject to any disclaimer, the term of this patent is extended or adjusted under 35 U.S.C. 154(b) by 744 days.

(21) Appl. No.: 09/891,578

(22) Filed: Jun. 25, 2001

(65) Prior Publication Data

US 2002/0196885 A1 Dec. 26, 2002

(51) Int. Cl.
 *H04L 7/00* (2006.01)
(52) U.S. Cl. ............... 375/371; 375/372; 327/144; 327/151; 327/160
(58) Field of Classification Search ........ 375/226, 375/354, 357, 359, 362, 371, 372; 365/194, 365/233; 327/156, 160, 161, 291, 292, 296, 327/299, 3, 141–150, 159; 341/111, 157
See application file for complete search history.

(56) References Cited

U.S. PATENT DOCUMENTS

| | | | |
|---|---|---|---|
| 5,479,457 A * | 12/1995 | Waters | 375/372 |
| 5,774,403 A | 6/1998 | Clark, II et al. | |
| 5,808,498 A | 9/1998 | Donnelly et al. | 327/255 |
| 5,859,550 A * | 1/1999 | Brandt | 327/156 |
| 6,125,157 A * | 9/2000 | Donnelly et al. | 375/371 |
| 6,229,471 B1 | 5/2001 | Herrmann | |
| 6,348,823 B1 * | 2/2002 | Pan | 327/159 |
| 6,392,457 B1 * | 5/2002 | Ransijn | 327/156 |
| 6,949,958 B2 * | 9/2005 | Zerbe et al. | 327/3 |
| 6,987,823 B1 * | 1/2006 | Stark et al. | 375/354 |

FOREIGN PATENT DOCUMENTS

| EP | 0 823 700 A2 | 2/1998 |
|---|---|---|
| GB | 2 112 236 A | 7/1983 |
| WO | WO 99/19806 | 4/1999 |

* cited by examiner

*Primary Examiner*—Dac V. Ha
(74) *Attorney, Agent, or Firm*—Vierra Magen Marcus & DeNiro LLP

(57) ABSTRACT

Disclosed herein are circuits in which a plurality of clock signals are generated by corresponding clock generators from one or more common clock references. The clock generators accept control values that specify the phases of the individual clocks. The actual phase of each clock signal potentially varies during operation, and the phases of the various clock signal are generally independent of each other. To detect or measure phase relationships, the disclosed circuits evaluate or compare the control values using arithmetic logic.

47 Claims, 4 Drawing Sheets

US 7,194,056 B2

DETERMINING PHASE RELATIONSHIPS USING DIGITAL PHASE VALUES

TECHNICAL FIELD

This invention relates to clock phase synchronization and to methods of detecting clock phases.

BACKGROUND

It is often necessary to synchronize data across different clock domains. As clock frequencies increase, however, it has become more difficult to achieve the proper timing required for such synchronization.

FIG. 1 shows a typical situation that requires synchronization of an asynchronous data signal. In this example, a memory controller 10 generates a clock signal 12 that is in turn provided to a memory device 14 to coordinate data transfers. In response to clock signal 12, memory device 14 generates a data signal 16 that is in turn received by the memory controller 10. Although the data signal is generated synchronously with clock signal 12, propagation delays between the memory device 14 and memory controller 10 cause the data signal to lose synchronization by the time it reaches controller 10. Furthermore, propagation delays are different for the different memory devices of the system, so that received data signals will have different phases depending on their sources. This brings about the need for synchronization within controller 10.

FIG. 2 shows a typical prior art circuit for synchronizing a received data signal DATAIN for use with an internal clock signal CLK2. In this example, a clock source 20 generates multiple reference clock signals having known, calibrated phase relationships between each other. For example, clock source 20 might generate eight clock signals having phases that vary by 45° from each other. Clock generation circuits 22 and 23 receive the reference clock signals produce respective clock signals CLK1 and CLK2 having phases that are specified by supplied digital phase control values PHASE1 and PHASE2.

In this example, CLK2 is the internal clock signal to which received data signals will be synchronized. CLK2 is received by the clock input of a latch or flip/flop 24 to latch the received data signal. Prior to this, however, the data signal is sampled and then synchronized by latches or flip/flops 25 and 26.

During normal operation, latch 25 is clocked by clock signal CLK1. This causes latch 25 to sample the received data signal DATAIN and to produce a captured data signal CDATA. The appropriate phase for CLK1 and the requisite digital value of PHASE1 to produce this phase are determined during an initialization procedure. During the initialization procedure, repeated attempts are made to read received data using different PHASE1 values and corresponding CLK1 phases. As a result of these attempts, a range of PHASE1 values is recorded as yielding valid results, and an intermediate one of these values is chosen for future use. During subsequent read operations, PHASE1 is set to this chosen value. Note that this setting might vary during operation, as data is received from different devices with different propagation delays.

As a result of the initialization procedure, CLK1 has an undetermined phase relationship with CLK2. Because of this, the captured data signal CDATA cannot be guaranteed to meet setup and hold times of any downstream latches or other sampling devices that are clocked by CLK2.

To ensure adequate setup and hold times at the input of latch 26, latches 26a and 26b are configured to clock CDATA either in phase with CLK2 or at 180° relative to CLK2, depending on the phase relationship of CLK2 to CLK1. Specifically, each of latches 26a and 26b receives CDATA as a data input. Latch 26a is clocked by CLK2 and Latch 26b is clocked by CLK2* (the "*" symbol is used to indicate negation or inversion). The outputs of the latches 26a and 26b are connected to the inputs of a two-to-one multiplexer 27. Depending on the value of its select input, the multiplexer presents either the clocked signal from 26a or the clocked signal from latch 26b.

The select input of multiplexer 27 receives a detect signal 30 from a phase detection circuit 31. Phase detection circuit 31 compares CLK1 and CLK2 to determine whether the phase of CLK2 relative to CLK1 is greater than 90°. If the phase is greater than 90°, detect signal 30 is asserted high to select the latched signal from latch 26a, which has been latched on the rising edge of CLK2. If the phase is less than 90°, detect signal 30 is asserted low to select the latched signal from latch 26b, which as been latched on the falling edge of CLK2.

Phase detection circuit 31 is implemented with a latch or flip/flop 32 and a signal delay element 33. Latch 32 has a clock input that receives CLK2. CLK1 is delayed 90° by delay element 33 and then provided to the data input of latch 32. This produces an output from latch 32 that is positive only if CLK2 lags CLK1 by more than 90°.

The described circuit is adequate, and has been used with success in various designs. At higher clock frequencies, however, the design effort becomes significant. Furthermore, typical delay elements (such as delay element 33) and other types of phase shifting circuits impose significant area and power requirements. Also, the phase at which the phase detection circuit triggers is fixed in the circuit described above. Therefore, it would be desirable to eliminate the need to compare clock signals to derive phase information and phase comparisons.

DETAILED DESCRIPTION

The following description sets forth specific embodiments of phase detection and synchronization circuits that incorporate elements recited in the appended claims. The embodiments are described with specificity in order to meet statutory requirements. However, the description itself is not intended to limit the scope of this patent. Rather, the inventors have contemplated that the claimed invention might also be embodied in other ways, to include different elements or combinations of storage elements similar to the ones described in this document, in conjunction with other present or future technologies.

Figure 1:
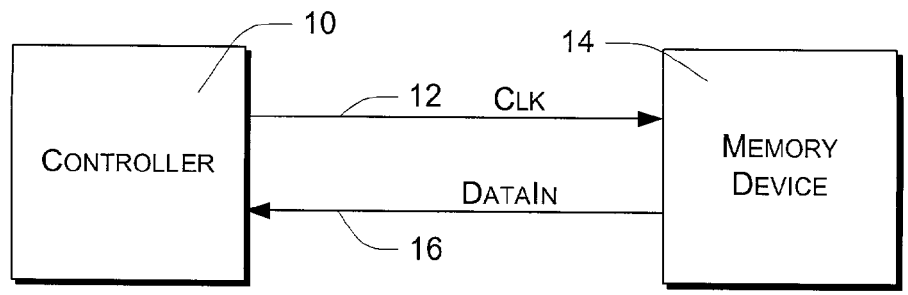
FIG. 1 is a block diagram of a memory system in accordance with the prior art.
Figure 3:
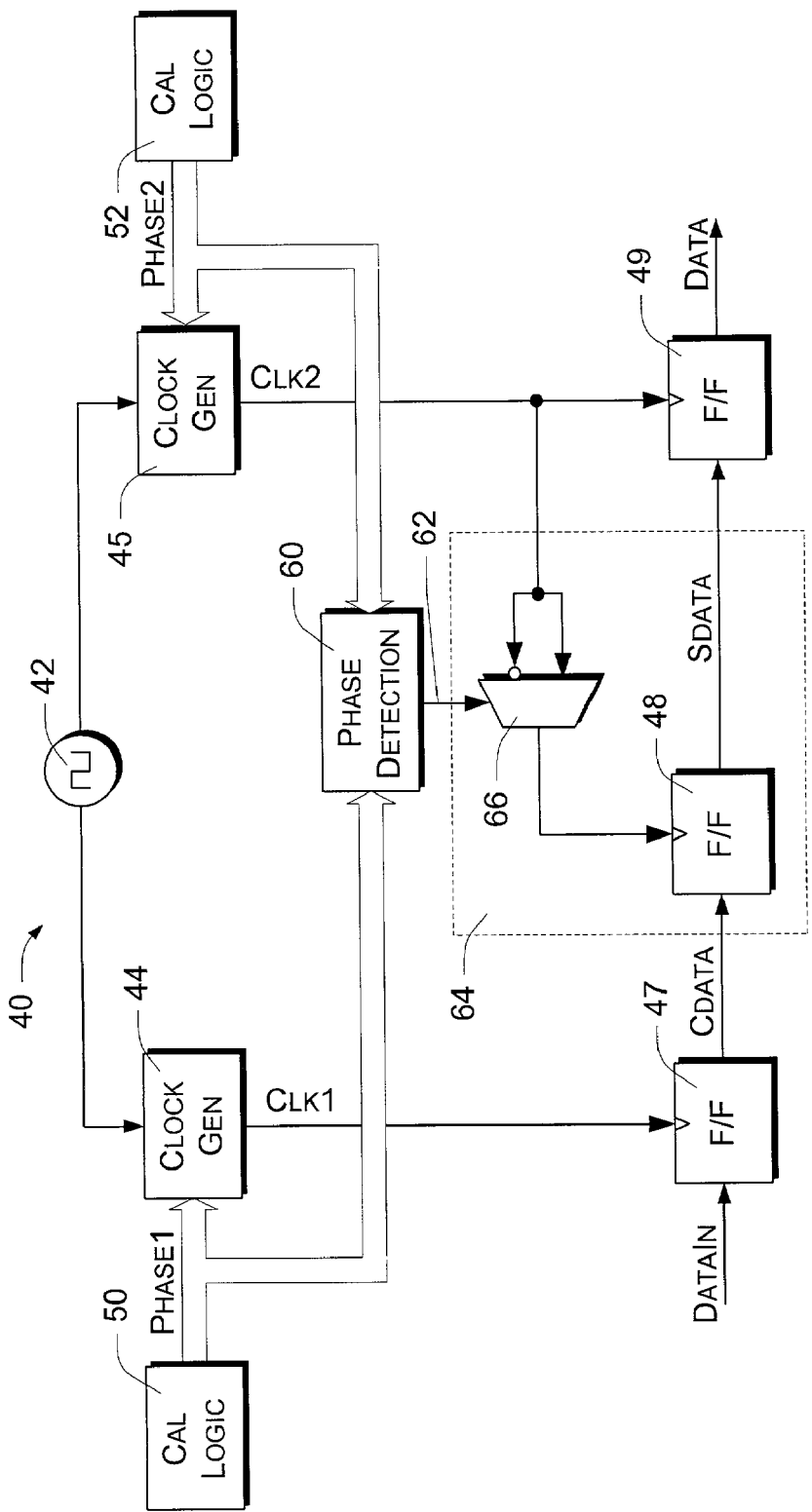
FIG. 3 is a block diagram showing a clock synchronization circuit in accordance with the invention.

FIG. 3 illustrates one embodiment of a clock generation and phase detection circuit 40. This circuit is useful in the context described above with reference to FIG. 1, where a device such as a memory controller receives a bussed data signal DATAIN from a plurality of memory devices. Depending on the source of the signal, DATAIN is subject to different propagation delays as it propagates from its source to the memory controller. From any particular memory device, DATAIN will have a fixed but initially unknown phase relationship with one or more internal clock signals of the memory controller. Clock generation and phase detection circuit 40 is used within the memory controller to receive and synchronize DATAIN.

Circuit 40 includes a reference clock source 42 that generates a plurality of common reference clock signals having known, calibrated phase relationships between each other. For example, clock source 40 might generate a series of eight clock signals having phases that are 45° apart from each other.

Clock generation and phase detection circuit 40 has a plurality of clock generators that generate respective timing or clock signals. Such clock signals are derived from the reference clock signals produced by reference clock source 42. This example shows two clock generators 44 and 45. Clock generation circuits 44 and 45 in this embodiment comprise phase interpolators or phase aligners that receive the common reference clock signals from clock source 42 and interpolate between them to produce respective clock signals CLK1 and CLK2. Digital phase control values PHASE1 and PHASE2 are supplied to the clock generators to specify the desired phases of CLK1 and CLK2, respectively.

Digital phase control values PHASE1 and PHASE2 are preferably digital words, each having a number of bits that is sufficient to provide the desired phase resolution. The control values are generated by independent calibration circuits 50 and 52, using calibration procedures which will be described below.

In this example, CLK1 is used to initially sample or capture the received data signal DATAIN. CLK2 is the internal, target clock signal to which received data signals will be synchronized.

The mesochronous data signal DATAIN is received by the data input of a latch or flip/flop 47. Latch 47 is clocked or triggered by CLK1 to produce a captured data signal CDATA, which is in turn received by the data input of a latch or flip/flop 48. Latch 48 is clocked or triggered either by CLK2 or by CLK2* (as will be described in more detail below) to produce a synchronized data signal SDATA, which is in turn received by the data input of a latch 49. Finally, latch 49 is clocked or triggered by CLK2 to create an internal data signal DATA.

Calibration circuit 50 generates digital input phase control value PHASE1 to specify the phase of clock signal CLK1 relative to reference clock source 42 and to target clock signal CLK2. The value of PHASE1 and the corresponding phase of CLK1 are determined during an initialization procedure, to provide an optimum timing relationship between CLK1 and the received data signal DATAIN. The calibration or initialization procedure results in a PHASE1 value that calibrates the phase of clock signal CLK1 relative to received data signal DATAIN.

Calibration logic 50 performs this initialization by attempting to capture data signal DATAIN using a range of different PHASE1 values. This procedure identifies a subrange of PHASE1 values that result in valid data capture. An optimum value of PHASE1 is then selected from these values. For example, the optimum value might be a value in the middle of the identified subrange. Other methods of calibration might be used in other embodiments.

Calibration logic 52 is responsible for setting digital target phase control value PHASE2 and the corresponding phase of target clock signal CLK2. The value of PHASE2 can be determined by calibration logic 52 in a variety of different ways to meet the internal timing requirements of the device of which circuit 40 forms a part. For purposes of this disclosure, however, it is assumed that the phase of CLK2 is independent of the phase of CLK1 and is similarly independent of the phase of incoming data signal DATAIN. Furthermore, it is likely that the phase relationship between CLK1 and CLK2 will vary depending on a variety of factors. As an example, consider the given implementation in which DATAIN is a bus signal sourced at different times by different memory devices, each of which is a different distance from a receiving circuit 40. In an example such as this, the phase of DATAIN varies depending on which memory device is currently generating DATAIN, and the phase of CLK1 is adjusted dynamically to account for this variability. The phase of CLK2, on the other hand, is established during initialization and remains fixed thereafter. Thus, the phase relationship between CLK1 and CLK2 varies during operation, depending on the particular source of DATAIN and the propagation delays imposed on DATAIN as it propagates from the sourcing device to receiving circuit 40.

Latch 48 provides synchronization between the two mutually independent timing domains defined by CLK1 and CLK2, respectively. More specifically, latch 48 clocks the captured data signal CDATA at an appropriate timing phase to produce a synchronized data signal SDATA. Even more specifically, latch 48 is clocked either on the rising edge of CLK2 (by CLK2) or on the falling edge of CLK2 (by CLK2*). Stated alternatively, latch 48 is clocked either in phase with CLK2 or at 180° relative to the phase of CLK2. The determination of whether to clock CDATA on rising or falling edge of CLK2 is made by considering the relative phases of CLK1 and CLK2, in a manner designed to provide adequate setup and hold times of the CDATA signal at the data input of latch 48. In further enhanced embodiments, latch 48 is clocked with one signal of a series of signals with relative phases to CLK2, such as 0°, 90°, 180° or 270°.

The determination of an appropriate phase at which to clock synchronization latch 48 is made by evaluation logic or phase detection logic 60. Rather than comparing the clock signals CLK1 and CLK2, phase detection logic 60 evaluates and compares digital control values PHASE1 and PHASE2 to detect a predetermined phase relationship between the clock signals and to determine the appropriate timing phase at which to clock captured data signal CDATA for synchronization with target clock signal CLK2.

In actual embodiment, phase detection logic 60 is an arithmetic logic unit that compares digital input phase control value PHASE1 to a reference value that represents a 90° phase offset from the target clock signal CLK2. The reference value can be expressed as REF=PHASE2+90, assuming that PHASE1 and PHASE2 are expressed as integers between 0 and 359. In practice, PHASE1 and PHASE2 will normally have some arbitrary range, such as between 0 and 255, where 0° is specified by a value of 0, 90° is specified by a value of 64, 180° is specified by a value of 128, and so on. In general terms, REF=PHASE2+VAL90; where VAL90 is a value representing 90°, in accordance with the particular scale at which PHASE1 and PHASE2 are expressed relative to clock generators 44 and 45.

Phase detection logic 60 generates a detect signal 62 to indicate the result of comparing PHASE1 to the reference value. Circuit 40 includes latching logic 64 that is responsive to phase detection logic 60 and detect signal 62 to latch captured data signal CDATA at an appropriate time or phase relative to CLK2. Latching logic 64 in this embodiment comprises latch 48 in combination with a two-to-one multiplexer 66. Depending on whether detect signal 62 is true or false, multiplexer 66 supplies CLK2 or CLK2* to the clock input of latch 48.

The resulting timing is characterized as follows: if target timing signal CLK2 lags the input clock signal CLK1 by more than 90, then detect signal 62 is true, multiplexer 16 supplies CLK2 to the clock input of latch 48, and CDATA is clocked at the rising edges of CLK2; if target timing signal CLK2 lags input clock signal CLK1 by less than 90, then detect signal 62 is false, multiplexer 16 supplies CLK2* to the clock input of latch 48, and CDATA is clocked at the falling edges of CLK2. Clocking in this manner ensures that CDATA meets setup and hold requirements of latch 48, and produces a synchronized data signal SDATA that can be sampled as needed by further components operating in the time domain established by target clock signal CLK2.

Figure 2:
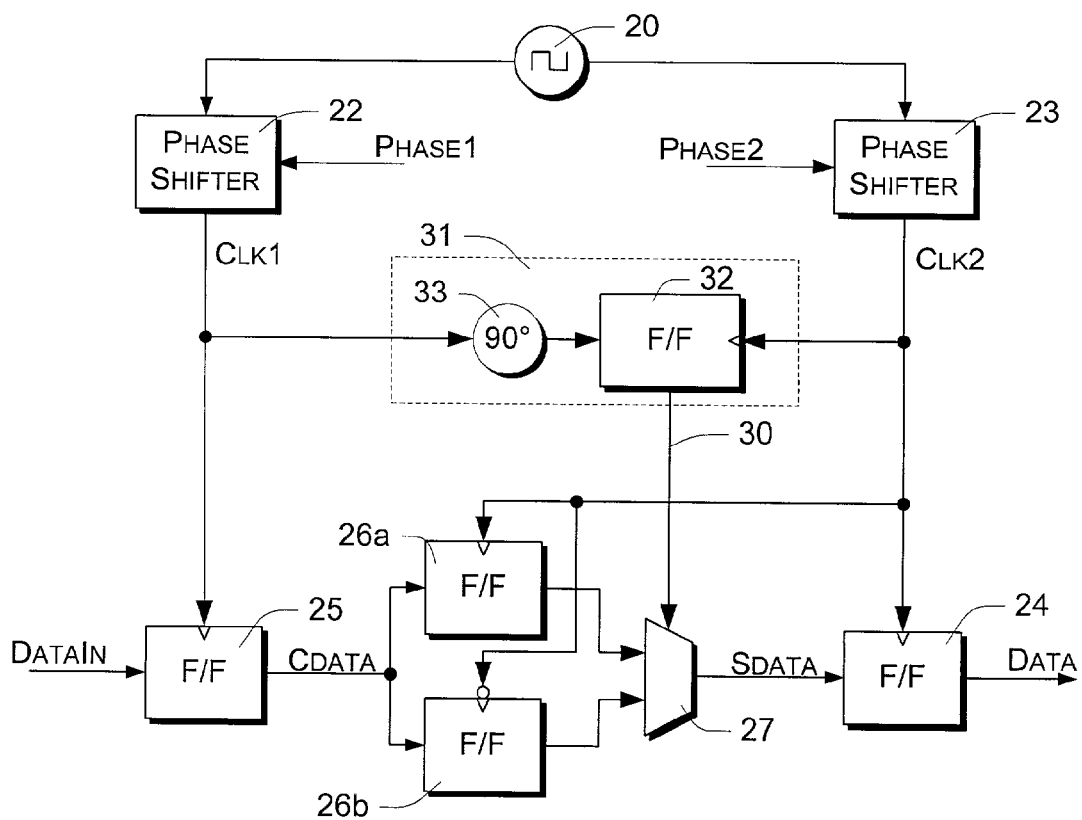
FIG. 2 is a block diagram of a synchronization circuit in accordance with the prior art.

The circuit of FIG. 3 effectively synchronizes data signal DATAIN across time domains, without the need to directly compare clock signals. This greatly simplifies the circuit in comparison to the prior art circuit shown in FIG. 2, by eliminating the need for a 90° delay element. In addition, the circuit of FIG. 3 can easily be used to detect and synchronize signals based on phase relationships other than 90°, simply by changing the nature of the numerical comparison performed by phase detection logic 60. Furthermore, the nature of numerical comparison by phase detection logic 60 allows more complex comparison such as with an arithmetic logic unit (ALU), look-up table, random combinatorial and/or sequential logic, etc.—phase detection logic 60 can be replaced by such different and/or more complex logic to achieve different types of synchronization objectives.

Figure 4:
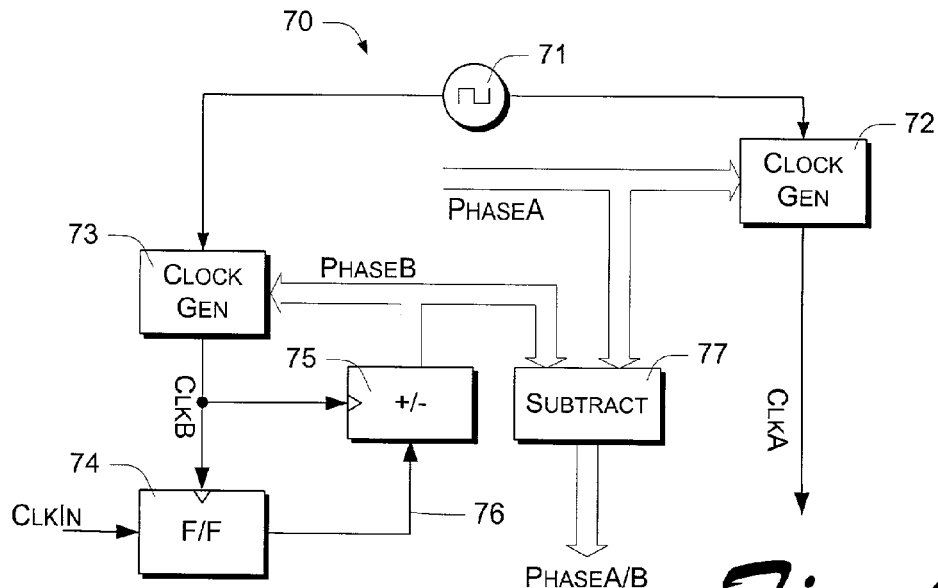
FIG. 4 is a block diagram showing a phase detection circuit in accordance with the invention.

The principles applied in the circuit of FIG. 3 can be used in other situations to detect or determine phase relationships. FIG. 4 shows one example, comprising a circuit 70 that detects the phase relationship between an internally generated reference clock signal CLKA and a received clock signal CLKIN whose phase is initially undetermined. In this example, CLKA is generated from a clock reference 71 by a clock generation circuit 72 in response to a digital phase control value PHASEA. PHASEA determines the phase of reference clock signal CLKA.

The circuit of FIG. 4 additionally includes a clock generation circuit 73 that produces a measurement clock signal CLKB having a phase that is set relative to reference clock signal CLKA by a phase control value PHASEB. PHASEA and PHASEB are preferably digital words, each having a number of bits equal to or greater than the desired phase measurement resolution.

Circuit 70 further comprises calibration logic that varies phase control value PHASEB to produce a predetermined phase relationship between measurement clock signal CLKB and received clock signal CLKIN. Specifically, the calibration logic varies phase control value PHASEB until the phase of measurement clock signal CLKB is approximately equal to the phase of received clock signal CLKIN.

The calibration logic comprises a latch or flip/flop 74 and an incrementer/decrementer 75. Latch 74 has a data input and a clock input: the data input receives clock signal CLKIN and the clock input receives measurement clock signal CLKB. This produces a detect signal 76 that is high if CLKIN leads CLKB and low if CLKIN lags CLKB.

Incrementer/decrementer 75 produces phase control value PHASEB in response to detect signal 76. Incrementer/decrementer 75 is clocked by measurement clock signal CLKB and responds by either incrementing or decrementing its digital output, depending on whether detect signal 76 is high or low. After a number of clock cycles, incrementer/decrementer 75 reaches a steady state in which its output varies by only a small amount.

Circuit 70 further comprises evaluation logic in the form of a subtraction element 77. Subtraction element 77 receives both digital control values PHASEA and PHASEB, and in response produces a digital, multi-bit value indicating the numerical difference PHASEA/B between PHASEA and PHASEB. This value corresponds to the phase difference between CLKA and CLKB. Because PHASEB has been adjusted to make the PHASE of CLKB equal to that of received clock signal CLKIN, PHASEA/B also represents the difference in phase between CLKIN and reference clock signal CLKA.

Figure 5:
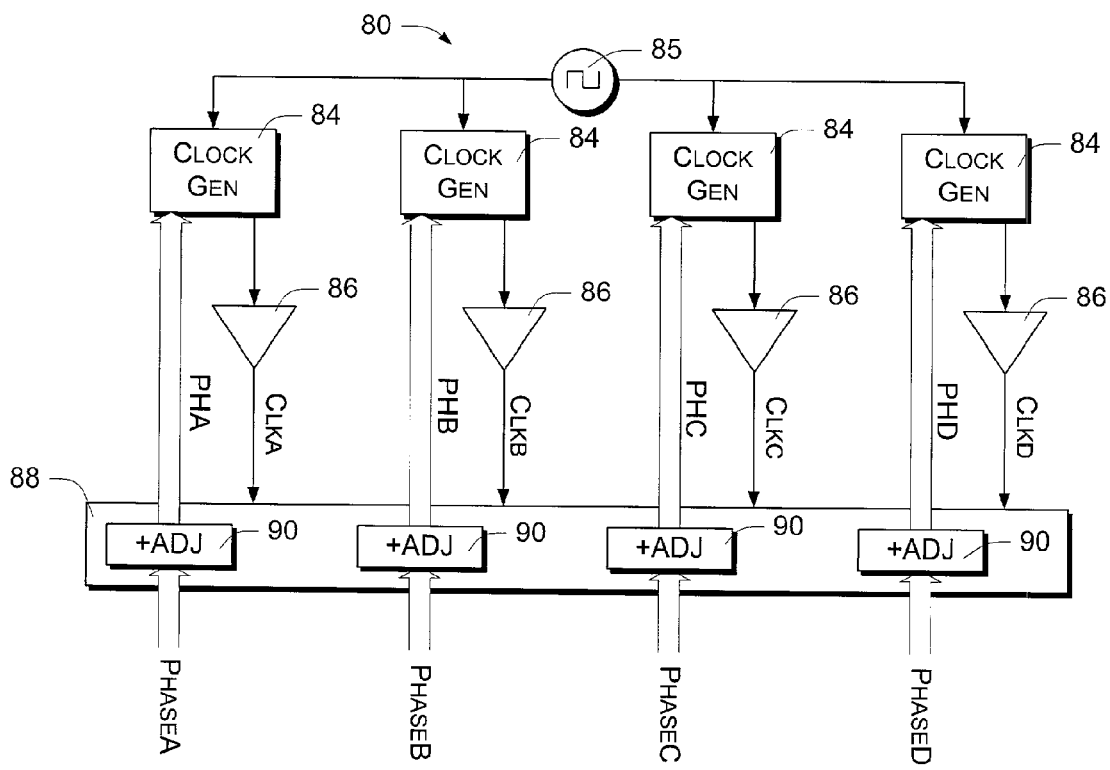
FIG. 5 is a block diagram showing a circuit in accordance with the invention for calibrating clocks relative to each other.

FIG. 5 illustrates yet another application of phase detection using the concepts already discussed. FIG. 5 shows a plurality of clock generation circuits 84 that generate respective clock signals CLKA, CLKB, CLKC, and CLKD in response to digital control values PHA, PHB, PHC, and PHD. The digital control values specify desired relative phases of the clock signals, as described above. The generated clock signals are based on or derived from a common clock reference 85, which supplies one or more common reference clock signals as discussed above.

The clock signals are buffered by elements 86, which subject the clock signals to different propagation delays. The circuit includes calibration logic 88 that adjusts or corrects the digital control values to account for the different propagation delays. Specifically, the calibration logic 88 receives digital control values PHASEA, PHASEB, PHASEC, and PHASED that indicate the desired phases of the clock signals. The calibration circuit has adjustment blocks 90 that add an appropriate correction value to each supplied control value PHASEA, PHASEB, PHASEC, and PHASED, producing the control values PHA, PHB, PHC, and PHD that are supplied to clock generators 84.

The calibration logic 88 performs an initialization or calibration procedure to determine the appropriate correction values for the respective digital control values. The initialization procedure comprises varying digital control values PHASEA, PHASEB, PHASEC, and PHASED to produce a predetermined phase relationship between the clock signals. More specifically, the calibration logic varies digital control values PHASEA, PHASEB, PHASEC, and PHASED so that the buffered clock signals CLKA, CLKB, CLKC, and CLKD have approximately identical phases. The calibration logic then derives correction values from the digital control values PHASEA, PHASEB, PHASEC, and PHASED that produce such phase alignment. Generally, the correction values comprise the differences between the control values that produce phase alignment. Normally, one of the clock signals will be designated as a reference, and the differences will be calculated with respect to the control value corresponding to the reference.

Subsequent to the initialization procedure, digital control values PHASEA, PHASEB, PHASEC, and PHASED are supplied by other circuits. Calibration logic 88 then compensates these control values with the derived correction values to produce compensated phase control values PHA, PHB, PHC, and PHD, to account for the different propagation delays of the clock signals CLKA, CLKB, CLKC, and CLKD.

Figure 6:
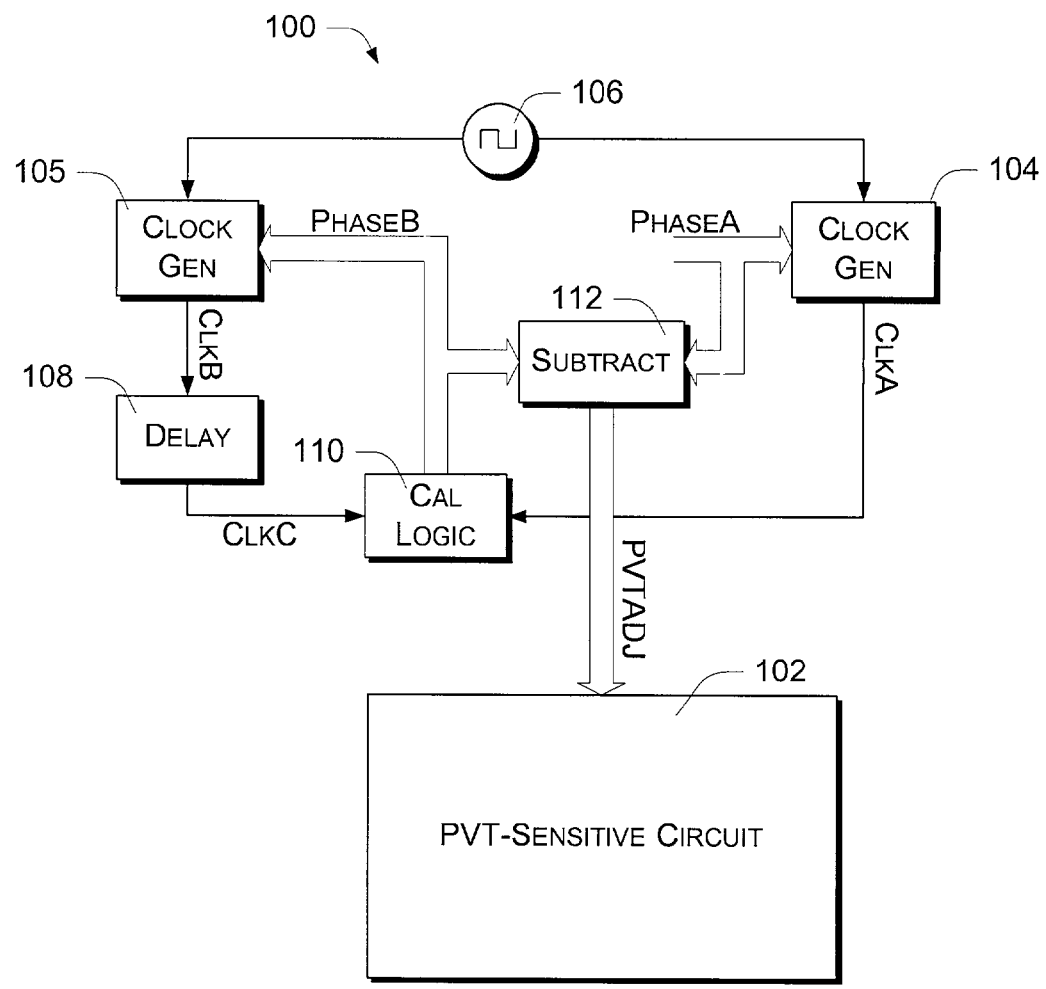
FIG. 6 is a block diagram showing a PVT detection and compensation circuit in accordance with the invention.

FIG. 6 shows another application of comparing digital phase control values, in this case to adjust for PVT variations. This example circuit 100 includes a PVT-sensitive circuit 102 that is sensitive to PVT (process, voltage, and temperature) variations. As an example, PVT-sensitive circuit 102 might comprise a driver that produces an output signal whose slew rate is sensitive to PVT variations. In some circuits, it is highly desirable to maintain a constant slew rate. Accordingly, it becomes necessary in such circuits to compensate for PVT variations in order to maintain the constant slew rate.

Circuit 100 includes two clock generators 104 and 105 that derive clock signals CLKA and CLKB from a clock reference 106. The relative phases of the clocks are established in the manner described above by digital phase control values PHASEA and PHASEB. In this example, clock signal CLKA acts as a fixed reference while PHASEB is varied to vary the phase of clock signal CLKB relative to that of CLKA.

The circuit includes a delay element 108. This delay element is designed and configured to delay clock signal CLKB by a phase delay that varies with PVT variations. The delay element produces a delayed clock signal CLKC.

Both CLKA and CLKC are provided to calibration logic 110. In a calibration procedure that is repeated periodically, logic 110 varies phase control value PHASEB to find a value of PHASEB that produces a predetermined phase relationship between delayed measurement clock signal CLKC and reference clock signal CLKA. More specifically, logic 110 finds a value of PHASEB that produces a CLKC phase that is approximately equal to that of reference clock signal CLKA. In an arithmetic element 112, this value of PHASEB is subtracted from PHASEA to yield a PVT adjustment value PVTADJ, which is in turn provided to PVT-sensitive circuit 102. PVT-sensitive circuit 102 is configured to compensate as necessary for changes in PVTADJ, thereby maintaining constant functionality regardless of PVT changes.

In the example embodiments disclosed above, clock signals are described and shown as being generated in response to digital control words. However, it may alternatively be the case that some or all of the clock signals in a particular circuit are generated by other means (such as by analog clock generators), with corresponding digital control words being generated by phase detection circuitry. The circuits and techniques described above are equally applicable in situations such as this, in which the various comparison techniques will be applied to the digital control words generated by the phase detection circuitry.

Although details of specific implementations and embodiments are described above, such details are intended to satisfy statutory disclosure obligations rather than to limit the scope of the following claims. Thus, the invention as defined by the claims is not limited to the specific features described above. Rather, the invention is claimed in any of its forms or modifications that fall within the proper scope of the appended claims, appropriately interpreted in accordance with the doctrine of equivalents.

We claim:

1. A method comprising:
   receiving a first digital control value establishing a phase of a first clock signal;
   receiving a second digital control value establishing a phase of a second clock signal; and
   comparing the first and second digital control values to detect a phase relationship between the first and second clock signals.

2. The method of claim 1, wherein the phase relationship between the first and second clock signals varies with PVT (process, voltage, and temperature) variations, the method further comprising adjusting a PVT-sensitive circuit as a function of the detected phase relationship between the first and second clock signals.

3. The method of claim 1, further comprising:
   calibrating the phase of the first clock signal relative to a received data signal;
   clocking an input latch with the first clock signal to latch the received data signal and to provide a captured data signal; and
   latching the captured data signal at a time that varies as a function of the detected phase relationship between the first and second clock signals to provide a synchronized data signal.

4. The method of claim 1, further comprising:
   calibrating the phase of the second clock signal relative to a received third clock signal;
   identifying the phase of the third clock signal relative to the first clock signal with reference to the detected phase relationship between the first and second clock signals.

5. A method comprising:
   receiving a first digital control value establishing a phase of a first clock signal;
   receiving a second digital control value establishing a phase of a second clock signal;
   comparing the first and second clock signals in a calibration procedure while varying the second digital control value to provide a predetermined phase relationship between the first and second clock signals;
   deriving a correction value from the second digital control value that provides the predetermined phase relationship between the first and second clock signals; and
   subsequent to the calibration procedure, compensating the second digital control value with the correction value to account for different propagation delays of the first and second clock signals.

6. A device comprising:
   a first clock generator that generates a first clock signal in response to a first digital control value, wherein the first digital control value establishes a phase of the first clock signal;
   a second clock generator to generate a second clock signal in response to a second digital control value, wherein the second digital control value establishes a phase of the second clock signal; and
   a phase detection logic to compare the first and second digital control values to detect a phase relationship between the first and second clock signals.

7. The device of claim 6, further comprising a PVT (process, voltage, and temperature) sensitive circuit that is responsive to the phase detection logic to compensate for PVT variations.

8. The device of claim 6, further comprising:
   a calibration logic to set the first digital control value to calibrate the phase of the first clock signal relative to a received data signal;
   an input latch clocked by the first clock signal to latch the received data signal and to provide a captured data signal; and a latching logic, in response to the phase relationship, to latch the captured data signal to provide a synchronized data signal relative to the second clock signal.

9. The device of claim 6, further comprising:
a calibration logic to receive a third clock signal having an undetermined phase relative to the first clock signal and to set the second digital control value to calibrate the phase of the second clock signal relative to the third clock signal;
wherein the phase detection logic compares the first and second digital control values to determine a phase of the third clock signal relative to the first clock signal.

10. A device comprising:
a first clock generator to generate a first clock signal in response to a first digital control value, wherein the first digital control value establishes a phase of the first clock signal;
a second clock generator to generate a second clock signal in response to a second digital control value, wherein the second digital control value establishes a phase of the second clock signal;
a calibration logic that operates in a calibration procedure to compare the first and second clock signals while varying at least one of the first and second digital control values to provide a predetermined phase relationship between the first and second clock signals;
wherein the calibration logic derives at least one correction value from at least one of the first and second digital control values that provide the predetermined phase relationship; and
wherein the calibration logic compensates at least one of the first and second digital control values with the at least one correction value to account for different propagation delays of the first and second clock signals.

11. A method of phase detection, comprising:
receiving a clock signal that has an undetermined phase relative to a reference clock signal;
generating a measurement clock signal having a phase that is established relative to the reference clock signal by a phase control value;
setting the phase control value to provide a predetermined phase relationship between the measurement clock signal and the received clock signal; and
evaluating the phase control value to detect a measured phase relationship of the received clock signal relative to the reference clock signal.

12. The method of claim 11, wherein setting the phase control value comprises varying the phase control value until the phase of the measurement clock signal is approximately equal to the phase of the received clock signal.

13. A phase detection device, comprising:
a clock generator to generate a measurement clock signal having a phase that is established relative to a reference clock signal by a phase control value;
a calibration logic to vary the phase control value to provide a predetermined phase relationship between the measurement clock signal and a received clock signal that has an undetermined phase; and
an evaluation logic to evaluate the phase control value to detect a phase relationship between the received clock signal and the reference clock signal.

14. The phase detection device of claim 13, wherein the calibration logic varies the phase control value until the phase of the measurement clock signal is approximately equal to the phase of the reference clock signal.

15. A method comprising:
generating a plurality of clock signals in response to a plurality of digital control values that specify a plurality of relative phases of the clock signals, the clock signals having different propagation delays;
varying the digital control values in a calibration procedure to provide a plurality of predetermined phase relationships between the clock signals;
deriving a plurality of correction values from the digital control values that provide the predetermined phase relationships;
subsequent to the calibration procedure, setting the digital control values to provide the relative phases of the clock signals; and
compensating the digital control values with the correction values to account for the different propagation delays of the clock signals.

16. The method of claim 15, wherein the plurality of clock signals have approximately identical phases when in the predetermined phase relationships.

17. The method of claim 15, wherein generating the plurality of clock signals comprises deriving the plurality of clock signals from one or more common reference clock signals.

18. A device comprising:
a plurality of clock generators to generate a plurality of clock signals in response to a plurality of digital control values that specify a plurality of relative phases of the clock signals, the clock signals having different propagation delays;
a calibration logic to vary the digital control values in a calibration procedure to provide a plurality of predetermined phase relationships between the clock signals; and
wherein the calibration logic derives one or more correction values from the digital control values to provide the plurality of predetermined phase relationships, the one or more correction values being used subsequent to the calibration procedure to account for the different propagation delays of the clock signals.

19. The device of claim 18, wherein the plurality of clock signals have approximately identical phases when in the predetermined phase relationships.

20. The device of claim 18, wherein the plurality of clock generators generate the plurality of clock signals from one or more common reference clock signals.

21. A method of phase detection, comprising:
generating a measurement clock signal having a phase that is established relative to a reference clock signal by a phase control value;
delaying the measurement clock signal by a delay that varies with PVT (process, voltage, and temperature) variations to obtain a delayed measurement clock signal;
varying the phase control value to obtain a digital PVT adjustment value that provides a predetermined phase relationship between the delayed measurement clock signal and the reference clock signal; and
adjusting a PVT-sensitive circuit as a function of the digital PVT adjustment value to compensate for the PVT variations in the PVT-sensitive circuit.

22. The method of claim 21, wherein varying the phase control value comprises varying the phase control value until the phase of the measurement clock signal is approximately equal to the phase of the reference clock signal.

23. A device comprising:
a clock generator to generate a measurement clock signal having a phase that is established relative to a reference clock signal by a phase control value;
one or more delay elements to delay the measurement clock signal by a delay that varies with PVT (process, voltage, and temperature) variations to obtain a delayed measurement clock signal;
a calibration logic to vary the phase control value to obtain a digital PVT adjustment value that provides a predetermined phase relationship between the delayed measurement clock signal and the reference clock signal; and
a PVT-sensitive circuit, responsive to the digital PVT adjustment value, to compensate for the PVT variations in the PVT-sensitive circuit.

24. The device of claim 23, wherein the calibration logic varies the phase control value until the phase of the measurement clock signal is approximately equal to the phase of the reference clock signal.

25. A method of synchronizing a received data signal with a target timing signal, comprising:
generating an input timing signal having a phase that is established relative to the target timing signal by an input phase control value;
setting the input phase control value to calibrate the phase of the input timing signal relative to the received data signal;
clocking the received data signal with the input timing signal to provide a captured data signal;
evaluating the input phase control value to determine a timing phase to clock the captured data signal for synchronization with the target timing signal; and
clocking the captured data signal at the timing phase to provide a synchronized data signal relative to the target timing signal.

26. The method of claim 25, wherein the evaluating comprises comparing the input phase control value to a reference value.

27. The method of claim 25, wherein:
the evaluating comprises comparing the input phase control value to a reference value; and
the reference value represents a 90° phase offset from the target timing signal.

28. The method of claim 25, wherein the evaluating comprises comparing the input phase control value to a target phase control value that establishes the phase of the target timing signal.

29. The method of claim 25, further comprising:
generating the target timing signal in response to a target phase control value that establishes a phase of the target timing signal.

30. The method of claim 25, further comprising:
generating the target timing signal in response to a target phase control value that establishes a phase of the target timing signal; and
wherein the evaluating comprises comparing the input phase control value to the target phase control value.

31. The method of claim 25, wherein the input phase control value is a digital value.

32. The method of claim 25, wherein the evaluating determines the timing phase to be (a) a phase of the target timing signal when the evaluation indicates that the target timing signal lags the input timing signal by more than 90° or (b) a phase that is 180° relative to the phase of the target timing signal when the evaluation indicates that the target timing signal lags the input timing signal by less than 90°.

33. The method of claim 25, further comprising:
clocking the synchronized data signal with the target timing signal.

34. A method of synchronizing a received data signal with a target clock signal, comprising:
setting a target phase control value to establish a phase of the target clock signal;
setting an input phase control value to establish a phase of an input clock signal;
clocking the received data signal with the input clock signal to provide a captured data signal;
comparing the target phase control value and the input phase control value to determine a timing phase to clock the captured data signal for synchronization with the target clock signal; and
clocking the captured data signal at the timing phase to provide a synchronized data signal relative to the target clock signal.

35. The method of claim 34, wherein the comparing comprises detecting whether the target clock signal lags the input clock signal by a predetermined amount based on the target and input phase control values.

36. The method of claim 34, wherein the comparing comprises detecting whether the target clock signal lags the input clock signal by 90° based on the target and input phase control values.

37. The method of claim 34, wherein the target and input phase control values are digital values.

38. The method of claim 34, wherein the comparing determines the timing phase to be (a) the phase of the target clock signal when the comparing indicates that the target clock signal lags the input timing signal by more than 90° or (b) a phase that is 180° relative to the phase of the target clock signal when the comparing indicates that the target clock signal lags the input clock signal by less than 90°.

39. The method of claim 34, further comprising:
clocking the synchronized data signal with the target timing signal.

40. The method of claim 34, further comprising:
setting the input phase control value to calibrate the phase of the input clock signal relative to the received data signal.

41. A device for synchronizing a received data signal with a target clock signal, comprising:
an input clock generator to generate an input clock signal at a calibrated phase relative to the received data signal, the input clock generator to receive an input phase control value to establish the calibrated phase of the input clock signal;
an input latch that is clocked by the input clock signal to latch the received data signal and to provide a captured data signal;
an evaluation logic to evaluate the input phase control value to determine a timing phase to clock the captured data signal for synchronization with the target clock signal; and
a latching logic to latch the captured data signal at the timing phase to provide a synchronized data signal relative to the target clock signal.

42. The device of claim 41, further comprising:
a target clock generator to generate the target clock signal, wherein the target clock generator receives a target phase control value to establish a phase of the target clock signal;
wherein the evaluation logic compares the target phase control value and the input phase control value to determine the timing phase.

43. The device of claim 41, wherein the evaluation logic compares the input phase control value to a reference value.

44. The device of claim 41, wherein:
- the evaluation logic compares the input phase control value to a reference value; and
- the reference value represents a 90° phase difference from the target clock signal.

45. A device as recited in claim 41, wherein the input phase control value is a digital value.

46. The device of claim 41, wherein the evaluation logic determines the timing phase to be (a) a phase of the target clock signal when the target clock signal lags the input clock signal by more than 90° or (b) a phase that is 180° relative to the phase of the target clock signal when the target clock signal lags the input clock signal by less than 90°.

47. The device of claim 41, further comprising:
- a second input latch to clock the synchronized data signal in response to the target clock signal.

* * * * *